Figure 1:
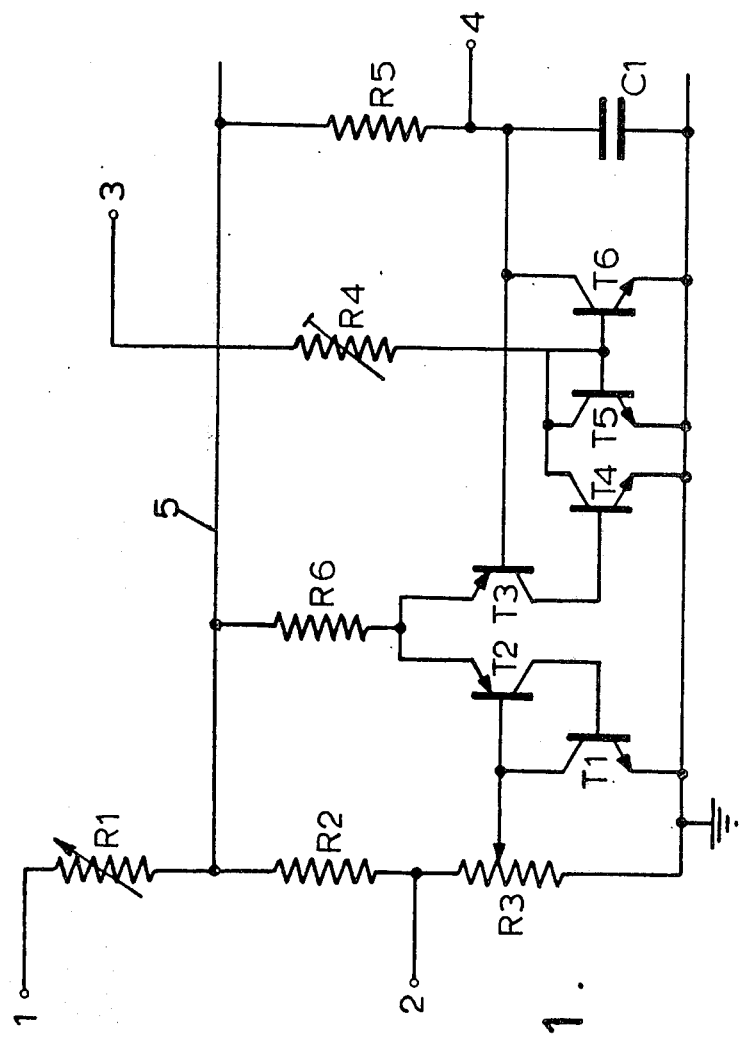

United States Patent [19]
Terry

[11] 3,938,002
[45] Feb. 10, 1976

[54] FIELD DEFLECTION CIRCUIT

[75] Inventor: Alan John Terry, London, England

[73] Assignee: U.S. Philips Corporation, New York, N.Y.

[22] Filed: July 24, 1974

[21] Appl. No.: 491,612

[30] Foreign Application Priority Data
July 24, 1973 United Kingdom............... 35109/73

[52] U.S. Cl. ................ 315/389; 315/399; 315/409; 315/410; 178/7.5 SE
[51] Int. Cl.² ..................... H01J 29/70; H01J 29/72
[58] Field of Search ........... 315/388, 389, 399, 403, 315/408, 409, 410, 387; 178/7.5 SE

[56] References Cited
UNITED STATES PATENTS
2,954,504 9/1960 Saudinaitis et al.................. 315/388
3,758,813 9/1973 Kitamura............................. 315/389

Primary Examiner—Maynard R. Wilbur
Assistant Examiner—T. M. Blum
Attorney, Agent, or Firm—Frank R. Trifari; Henry I. Steckler

[57] ABSTRACT

A deflection circuit has a sawtooth generator with a control input and an output stage, each having a different power supply. A control voltage derived from the output stage supply is applied to the control input to decrease the flyback period as the output stage supply voltage increases.

8 Claims, 4 Drawing Figures

FIELD DEFLECTION CIRCUIT

THE INVENTION relates to a field deflection circuit for television display apparatus.

In clamped flyback field deflection circuits in which the flyback pulse is clamped to a fixed potential the flyback pulse should be of such duration that the current flow in the deflection coils is exactly reversed. Failure to achieve this results in a non-linear scan, the non-linearity being particularly apparent at the start of the scan. One method of ensuring linearity of scan in clamped flyback field output stages is the use of current feedback to ensure that the scan does not start until the current in the deflection coil has fully reversed. However consistent interlace is difficult to achieve when using current feedback especially with 110° deflection tubes, and particularly when large line frequency currents flow in the field deflection coils to compensate for pin cushion distortion.

It is an object of the invention to provide an alternative method of maintaining the linearity of the field scan in a clamped flyback field deflection circuit.

The invention provides a clamped flyback field deflection circuit including means for producing flyback pulses whose duration increases as the picture height increases and decreases as the supply voltage to the output stage of the clamped flyback field deflection stage increases.

The means for producing flyback pulses may comprise means for charging a capacitor from a voltage source, the voltage of which increases as the picture height increases, means for causing the capacitor to discharge when the charge thereon reaches a predetermined value, and means for controlling the discharge path of the capacitor to cause the discharge path to pass a current dependent on the supply voltage to the output stage.

The apparatus may include control means of varying the picture height including a potentiometer, one point on which may be connected to a second supply voltage, and a second point on which forms the source of the voltage which increases as the picture height increases.

The second supply voltage may be the supply voltage to the output stages, and may be derived from a line scan rectified supply.

The discharge path of the capacitor may comprise the collector emitter path of a transistor and means for controlling the impedance of the collector-emitter path of the transistor. The means for controlling the impedance of the collector emitter path of the transistor may comprise means for producing a current proportional to the supply voltage to the output stage and feeding the current to the base of the transistor. The transistor may be connected to a second transistor to form a current mirror.

The output stage may include a first path for applying a deflection signal to the deflection coil and a second path for applying the flyback pulse to the deflection coil. The flyback pulse may be subdivided to produce separate pulses and be applied to the output stage to control the switching thereof.

The invention further provides television display apparatus including such a clamped flyback field deflection circuit.

Figure 2:
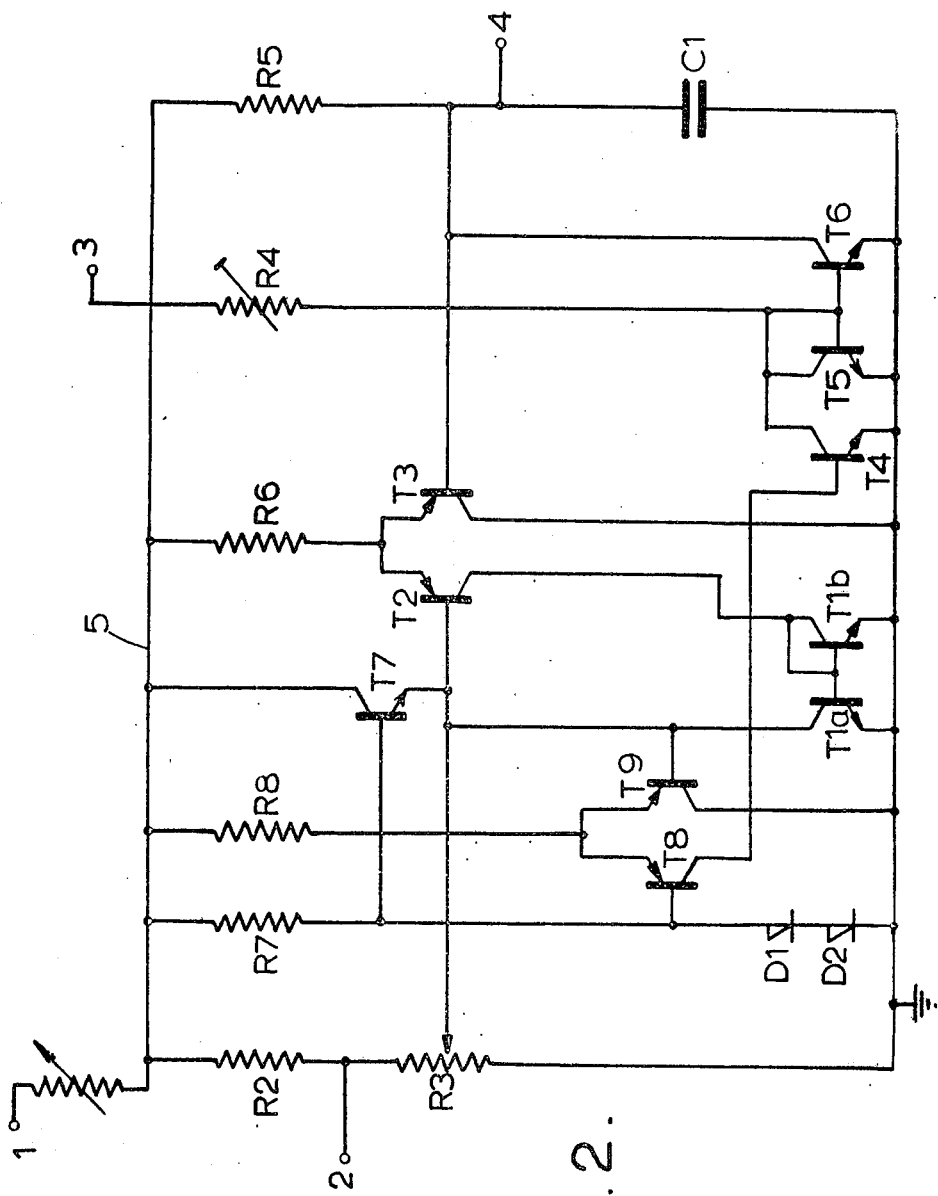
Figure 3:
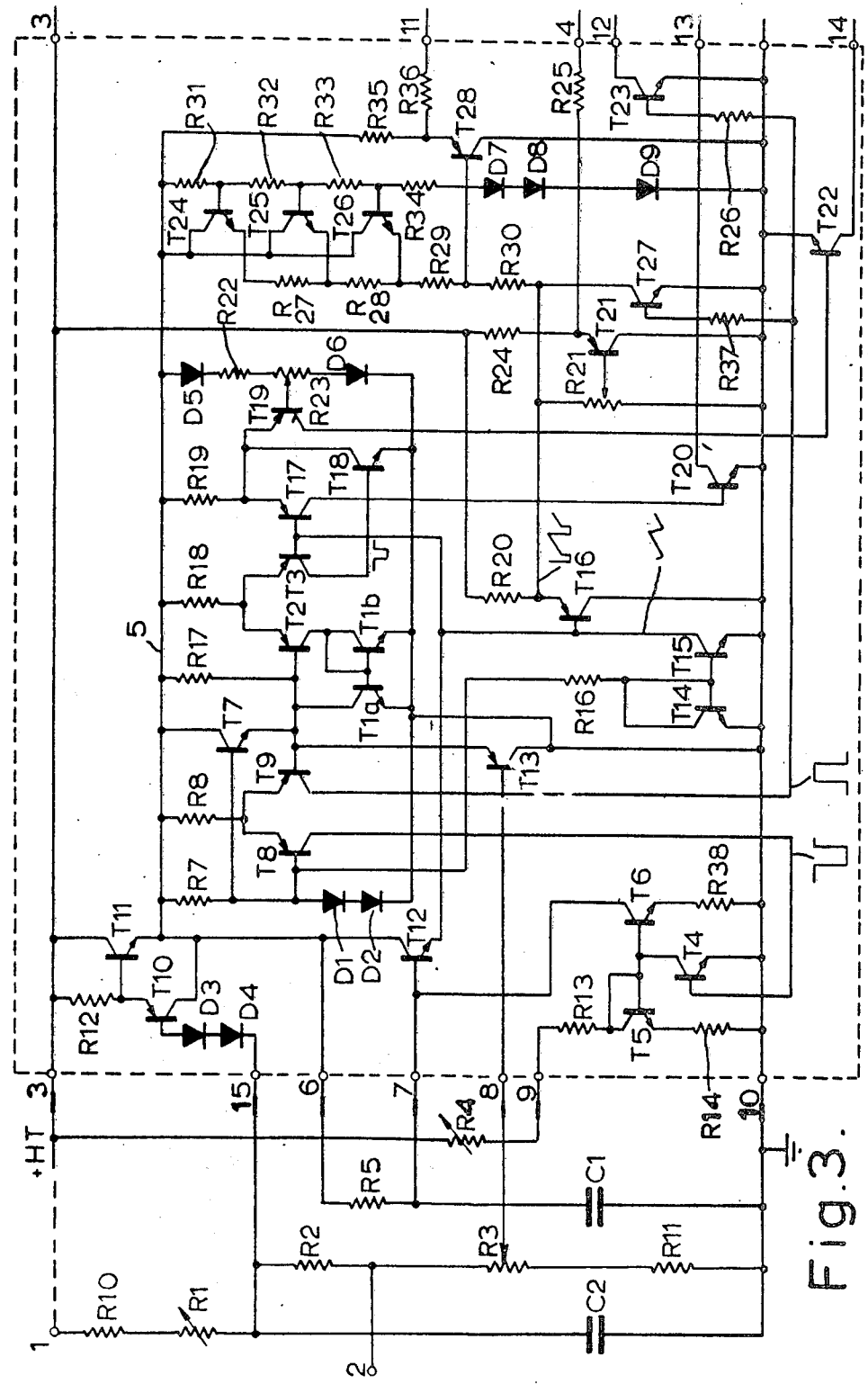
Figure 4:
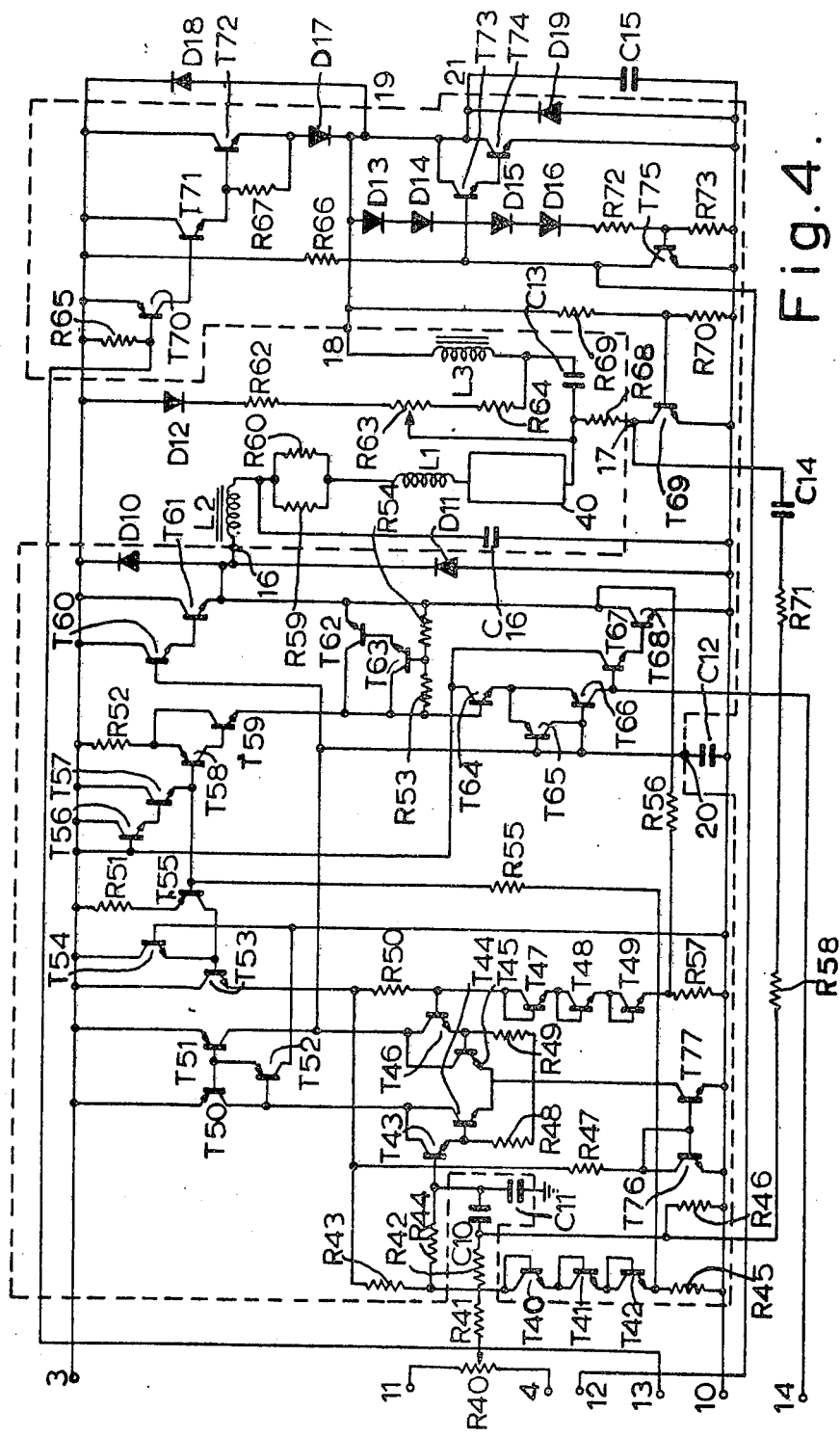

The above and other features of the invention will be more readily understood by a perusal of the following description with reference to the accompanying drawings in which:

FIG. 1 shows a theoretical circuit for producing a sawtooth waveform for use with a field deflection circuit according to the invention, whose flyback time varies as the voltages supplied to two terminals are varied, FIG. 2 shows a modification of the circuit shown in FIG. 1, FIG. 3 shows a practical version of the circuit of FIG. 1 adapted for fabrication as an integrated circuit, in monolithic form, and FIG. 4 shows a suitable output stage for the circuit of FIG. 3.

As shown in FIG. 1 the circuit includes the series arrangement of a variable resistor R1, a resistor R2 and a potentiometer R3 connected between terminal 1 and an earth rail. The junction of variable resistor R1 and resistor R2 is connected to line 5 which acts as a positive supply rail for the rest of the circuit. The junction of resistor R2 and potentiometer R3 is connected to terminal 2. The slider of potentiometer R3 is connected to the collector of an n.p.n transistor T1 and to the base of a p.n.p transistor T2. The emitter of transistor T1 is connected to the earth rail while its base is connected to the collector of transistor T2. The emitter of transistor T2 is connected to the emitter of a p.n.p transistor T3 and via a resistor R6 to a positive supply rail 5. The collector of transistor T3 is connected to the base of an n.p.n. a transistor T4 which has its emitter connected to the earth rail and its collector connected to the junction of the collector and base of an n.p.n transistor T5, the base of an n.p.n transistor T6, and one end of a variable resistor R4. The other end of variable resistor R4 is connected to a terminal 3. The emitters of transistors T5 and T6 are both connected to the earth rail. The series arrangement of a resistor R5 and a capacitor C1 is connected between the positive supply rail 5 and the earth rail with one end of resistor R5 connected to the positive supply rail 5. The junction of resistor R5 and capacitor C1 is connected to the junction of the collector of transistor T6, the base of transistor T3, and terminal 4.

In operation, a first source of direct voltage is applied between 1 and earth. The direct voltage may be derived, for example, from a line scan rectified supply. This will maintain a substantially constant picture aspect ratio if the line scan amplitude varies, since the amplitude of the ramp voltage generated will depend on the supply voltage on line 5. Terminal 3 is connected to a second source of direct voltage which also serves as a supply voltage for a field output stage which is driven by the sawtooth waveform generator. The second source of direct voltage is generated separately from the first source of direct voltage. When the supply voltages are initially applied to this circuit capacitor C1 will be discharged causing T3 and T4 to be ON and T1 and T2 to be OFF. The current through resistor R4 will flow through transistor T4 and since $V_{ce}(SAT)$ is less than $V_{be}(SAT)$ T5 and T6 will be OFF. Capacitor C1 then begins to charge through resistor R5 and generates a ramp voltage which is available at terminal 4. As the charge on capacitor C1 increases the voltage at the base of transistor T3 increases until it reaches the voltage at the slider of potentiometer R3 when transistor T2 starts to conduct. Positive feedback round the loop comprising transistors T1 and T2 causes these transistors to switch rapidly from being OFF to being ON, causing transistors T3 and hence T4 to switch OFF. Transistors T5 and T6 are now turned ON and the capacitor C1 discharges through the collector-emitter path of transistor T6. Transistors T5 and T6 are connected to form a current mirror, the operation of which is as follows.

When a voltage is applied to terminal 3 and transistor T4 is switched off a current will flow through resistor R4 to the base of transistor T5 and since the base and collector of transistor T5 are connected together this current will flow through the collector-emitter path of transistor T5 and also through its base-emitter path. However, if the gain of transistor T5 is high the proportion of the current flowing through the base emitter path of transistor T5 will be very low. The potential at the base of transistor T5 will set the current flow through the collector-emitter path of transistor T5 and as the base of transistor T5 is connected to the base of transistor T6 and the collector of transistor T6 is fed with a voltage from a low impedance source, capacitor C1, if transistors T5 and T6 are identical then the current through the collector emitter path of transistor T6 will be equal to the current through the collector emitter path of transistor T5. Transistor T6 will therefore conduct a constant current, which is set by the value of the voltage applied to terminal 3 and the setting of variable resistor R4, causing the voltage across capacitor C1 to fall linearly. When the voltage across capacitor C1 has fallen to a sufficiently low value transistor T3 will turn ON, causing transistor T4 to turn ON also. Consequently transistors T1, T2, T5 and T6 turn OFF and capacitor C1 starts to charge again.

Adjustment of variable resistor R1 varies the scan amplitude and hence picture height since as the voltage at the positive supply rail increases the potential at the slider of potentiometer R3 increases and hence the potential to which the capacitor C1 charges will also increase. Thus the amplitude of the waveform at terminal 4 depends on the setting of variable resistor R1 but the frequency of the waveform remains substantially constant. Adjustment of potentiometer R3 will vary the frequency of the waveform and will also affect the amplitude of the waveform, since the potential at the slider of potentiometer R3 governs the potential to which capacitor C1 charges. The output frequency may be synchronised by applying negative going pulses to terminal 2. These pulses temporarily lower the potential at the base of transistor T2 and if the capacitor C1 has charged to a sufficiently high level the pulses will cause immediate switching of transistors T1 and T2, and C1 will start to discharge. The flyback time is governed by the voltage applied to terminal 3 and the setting of variable resistor R4 as these components together with transistor T5 control the impedance of the collector-emitter path of transistor T6.

Thus this circuit gives a flyback time which increases as the scan amplitude increases, since the time taken to discharge capacitor C1, at constant current, increases if the voltage to which the capacitor is charged is increased, and the voltage on positive supply rail 5 affects the voltage to which the capacitor is charged. The flyback time is also dependent on the voltage applied to terminal 3 and if this voltage is the supply voltage to the output stage then as this voltage increases the impedance of the collector-emitter path of transistor T6 decreases and the capacitor C1 discharges more quickly and the flyback time is reduced. Conversely as the voltage applied to terminal 3 decreases the impedance of the collector-emitter path increases and the capacitor C1 discharges more slowly and the flyback time is increased.

With the circuit of FIG. 1 unless the components are carefully selected so that transistor T1 is barely saturated when it is switched ON the circuit will lock up with transistors T3 and T4 partially conducting and the charging current from resistor R5 flowing through transistor T6. In order to reduce this problem the circuit may be modified as shown in FIG. 2.

The circuit of FIG. 2 shows transistor T1 replaced by two n.p.n transistors T1a and T1b which are connected to form a current mirror and have approximately unity gain. The impedance of potentiometer R3 is increased and n.p.n transistor T7 is introduced to clamp the lower trip level, i.e. the voltage at the base of transistor T2 while capacitor C1 is discharging, to approximately 0.6V. Transistors T8 and T9 both p.n.p form a comparator which controls the flyback current mirror formed by transistors T5 and T6. Diodes D1 and D2 produce a voltage reference level of approximately 1.2V at the base of transistor T8.

This circuit operates in a similar manner to the circuit described with reference to FIG. 1 as far as the generation of the ramp voltage is concerned. However, at the start of the flyback, when transistors T1a, T1b and T2 turn ON, most of the collector current flowing in transistor T1a is derived from transistor T7. This causes the potential at the base electrodes of transistors T2 and T9 to be held at about +0.6V. This causes transistor T9 to be held ON and transistor T8 to be OFF since the potential at the base of transistor T8 is held at about +1.2V by diodes D1 and D2. Since transistor T8 if OFF there is no base current supplied to transistor T4 and consequently transistor T4 is OFF. The timing capacitor C1, therefore, discharges linearly, through the collector-emitter path of transistor T6, under the control of the voltage applied to terminal 3 and the setting of variable resistor R4. When the charge on capacitor C1 has fallen to such a value that the voltage across it, and hence at the base of transistor T3, is approximately +0.6V transistor T3 will switch ON and consequently transistors T1a, T1b and T2 switch OFF. Transistor T9 will not switch OFF until the voltage at its base and hence at the base of transistor T2 has reached approximately +1.2V. This allows transistors T1a, T1b and T2 to start to switch OFF before transistor T9. When the voltage at the base of transistor T9 rises above +1.2V transistor T8 will switch on which in turn causes transistor T4 to switch ON. Since $V_{ce}$(SAT) of transistor T4 is less than $V_{be}$(SAT) of transistors T5 and T6 this causes transistors T5 and T6 to switch OFF and the current through resistor R4 is conducted through transistor T4. Since the discharge path for capacitor C1 is now broken it commences to recharge via resistor R5 and the generation of the ramp voltage recommences.

FIG. 3 shows a modification of the circuit of FIG. 1 in a form suitable for fabrication in monolithic form as an integrated circuit, the conductivity types of the transistors being as shown. The components inside the broken line in this Figure and FIG. 4 are those which may be included in the integrated circuit. Components which have the same function as those in FIGS. 1 and 2 are given the same reference numerals as in those Figures.

The series arrangement of a resistor R10, variable resistor R1, resistor R2, potentiometer R3 and resistor R11 is connected between terminal 1 and a terminal 10. The junction of potentiometer R1 and resistor R2 is connected to a terminal 15 and via a capacitor C2 to terminal 10. The junction of resistor R2 and potentiometer R3 is connected to a terminal 2. The series arrangement of a resistor R5 and a capacitor C1 is connected between a terminal 6 and terminal 10, the junction of capacitor C1 and resistor R5 being connected to a terminal 7. Potentiometer R4 is connected between terminal 3 and a terminal 9. Terminal 3 is connected to the junction of a first resistor R12, a second resistor R20, a third resistor R24 and the collector of transistor T11. The base of transistor T11 is connected to the junction of resistor R12 and the emitter of a transistor T10 whose base is connected via two serially connected diodes D3 and D4 to terminal 15. The emitter of transistor T11 is connected to the collector of transistor T10 and positive supply rail 5. Terminal 9 is connected to one end of a resistor R13 the other end of which is connected to the junction of the base of transistor T6, the collector of transistor T4 and the base and collector of transistor T5. The emitter of transistor T5 is connected to one end of a resistor R14 the other end of which is connected to terminal 10, the emitter of transistor T4, and one end of a resistor R38. The other end of resistor R38 is connected to the emitter of transistor T6. The collector of transistor T6 is connected to the base of a transistor T12 and to terminal 7. The base of transistor T4 is connected to the collector of transistor T8. The collector of transistor T12 is connected to terminal 6 and the positive supply rail 5. The series arrangement of resistor R7 and the two diodes D1 and D2 is connected between the positive supply rail 5 and terminal 10, the junction of resistor R7 and diode D1 being connected to the base of transistor T7, the base of transistor T8, and one end of a resistor R16. The emitter of transistor T8 is connected to the emitter of transistor T9 and via resistor R8 to the positive supply rail 5. The collector of transistor T7 is connected to the positive supply rail 5 while its emitter is connected to the base of transistor T9, the base of transistor T2, the collector of transistor T1a, the emitter of a transistor T13, and via a resistor R17 the positive supply rail 5. The base of transistor T13 is connected to terminal 8 while its collector is connected to terminal 10. The collector of transistor T9 is connected via a resistor R26 to the base of a transistor T23 and via a resistor R37 to the base of a transistor T27. The other end of resistor R16 is connected to the base of a transistor T15 and to the base and collector of a transistor T14. The emitters of transistors T14 and T15 are connected to terminal 10. The collector of transistor T15 is connected to the base of a transistor T16, the base of transistor T3, the base of a transistor T17 and the emitter of transistor T12. The emitters of transistors T2 and T3 are commoned and connected via a resistor R18 to the positive supply rail 5. The collector of transistor T2 is connected to the base of transistor T1a and to the base and collector of transistor T1b while the collector of transistor T3 is connected to the base of a transistor T18. The emitter of transistor T17 is connected to the emitter of a transistor T19, the collector of transistor T18, and via a resistor R19 the positive supply rail 5. The emitters of transistors T1a, T1b, and T18 are connected to terminal 10. The series arrangement of a diode D5, a resistor R22, a resistor R23 and a diode D6 is connected between the positive supply rail 5 and terminal 10. The base of transistor T19 is connected to a tapping point on resistor R23. The collector of transistor T17 is connected to the base of a transistor T20 while the collector of transistor T19 is connected to the base of a transistor T22. The emitter of transistor T16 is connected to the junction of a resistor R20, a resistor R21, a resistor R30 and the collector of a transistor T27. The other end of resistor R21 is connected to terminal 10 while a tapping point on resistor R21 is connected to the base of a transistor T21, the emitter of which is connected to the junction of resistor R24 and a resistor R25 whose other end is connected to terminal 4. The other end of resistor R30 is connected to the junction of a resistor R29 and the base of a transistor T28. The emitter of transistor T28 is connected through a resistor R35 to the positive supply rail 5 and through a resistor R36 to a terminal 11. The other end of resistor R29 is connected to the junction of a resistor R28 and the emitter of a transistor T26. The emitter of a transistor T25 is connected to the junction of resistor R28 and a resistor R27 the other end of which is connected to the emitter of a transistor T24. The collectors of transistors T24, T25, and T26 are connected to the positive supply rail 5. The series arrangement of a resistor R31, a resistor R32, a resistor R33, a resistor R34, a diode D7, a diode D8 and a diode D9 is connected between the positive supply rail 5 and terminal 10. The base of transistor T24 is connected to the junction of resistors R31 and R32, the base of transistor T25 to the junction of resistors R32 and R33, and the base of transistor T26 to the junction of resistors R33 and R34. The emitters of transistors T20, T27, T23, and T22 and the collectors of transistors T21, T16 and T28 are connected to terminal 10. The collector of transistor T23 is connected to terminal 12, the collector of transistor T20 to terminal 13, and the collector of transistor T22 to terminal 14.

In operation, a first source of direct voltage is connected between terminals 1 and 10 and a second of direct voltage is connected between terminals 3 and 10. The first source of direct voltage is preferably derived from a line scan rectified supply, as described with reference to FIG. 1, in order to stabilize the picture aspect ratio. Adjustment of variable resistor R1 adjusts the scan amplitude and the voltage produced at the junction of variable resistor R1 and resistor R2 is applied via terminal 15 to a common collector amplifier circuit comprising diodes D3 and D4, resistor R12 and transistors T10 and T11. Thus a positive supply voltage approximately 1.2V higher than the voltage applied at terminal 15 is produced on the positive supply rail 5.

The diodes D3 and D4 increase the potential on supply rail 5 by two forward voltage drops i.e. approximately 1.2V so that the aiming voltage for capacitor C1 is approximately 1.2V above the voltage at the junction of resistors R1 and R2. The potential divider chain comprising resistors R2 and R11 and potentiometer R3 provide the other input to the comparator formed by transistors T2 and T3 and give a lower trip level of approximately 1.2V due to the voltage drops in transistors T12 and T13. The sawtooth waveform is produced in a similar way to that described with reference to FIG. 2 and the components to both FIGS. 2 and 3 are shown with the same references.

The ramp voltage produced at the junction of capacitor C1 and resistor R5 is fed via a common collector stage which includes transistor T12 to the base of transistor T3. This enbales a lower value capacitor to be used as the timing capacitor C1 and hence reduces the discharge current through transistor T6. The frequency control potentiometer R3 is buffered from the base of transistor T2 by a common collector stage which includes transistor T13. The ramp voltage from terminal 7 is fed through two further common collector stages including transistors T16 and T21 to give a low output impedance at terminal 4. Transistor T9 is not now directly connected to the earth but instead is used to produce a flyback pulse which is applied to the bases of transistors T27 and T23. Transistors T23 then feeds the flyback pulse to terminal 12. The emitter of transistor T16 and the collector of transistors T16 and T27 are commoned and hence the output at this point is the sum of the sawtooth waveform applied to the base of transistor T16 and the flyback pulse applied to the base of transistor T27. This waveform is applied to a shaping network which includes transistors T24, T25, T26 and associated resistors R27, R28, R29, R30, R31, R32, R33, R34 and diodes D7 and D8. The output from this shaping network, taken from the junction of resistors R29 and R30, is applied to the base of transistor T28. The shaped waveform is then available from terminal 11. The shaping network is introduced to give 's' correction for the first half of the scan to the ramp waveform and is selected to over correct the waveform. The 's' correction for the second half of the scan is produced by the fall in the rate of charging the capacitor C1 as the aiming voltage is approached. A delayed flyback pulse is available from terminal 13 and is generated by a comparator formed by transistors T17 and T19. The collector of transistor T3 is connected to the base of transistor T18 instead of, as in the previous figures, to earth. In this way when transistor T3 is switched ON, i.e. when the capacitor C1 is charging, transistor T18 is switched ON and holds transistors T17 and T19 OFF. When transistor T3 switches OFF, i.e. when capacitor C1 is discharging, the voltage across capacitor C1 is compared with that applied to the base of transistor T19. While the voltage across capacitor C1 is greater (more positive) than that applied to the base of transistor T19, transistor T19 will conduct and consequently transistor T22 will also conduct to connect terminal 14 to terminal 10. When the voltage across capacitor C1 falls to a lower value than that applied to the base of transistor T19 transistor T17 switches ON and transistor T19 switches OFF. Consequently transistor T20 now conducts and connects terminal 13 to terminal 10 while transistor T22 becomes non conducting and isolates terminal 14 from terminal 10. The voltage applied to the base of transistor T19 is selected so that during about the first 30% of the flyback period transistor T22 is conductive and provides a pre-delay pulse at terminal 14 and during the rest of the flyback period transistor T20 is conductive and provides a delayed pulse at terminal 13.

FIG. 4 shows a suitable output stage for use with the circuit of FIG. 3 in a clamped flyback field output circuit according to the invention. The terminals having the same reference numerals as those in FIG. 3 are connected to the corresponding terminals of FIG. 3. While the conductivity types of the transistors are as shown. A potentiometer R40 is connected between terminals 4 and 11 with its slide connected to one end of a resistor R41 which is connected in series with a resistor R42. The other end of resistor R42 is connected to the junction of a capacitor C10, a resistor R46 whose other end is connected to terminal 10, and a resistor R58. The other end of capacitor C10 is connected to the junction of a resistor R44, the base of a transistor T43, and one end of a capacitor C11 whose other end is connected to earth. The collector of transistor T43 is connected to the collector of a transistor T44, the collector of a transistor T50 and the base of a transistor T52. The emitter of transistor T52 is connected to the base of transistor T50 and the base of a transistor T51, whose collector is connected to the collectors of two transistors T45, and T46, to the bases of three transistors T60, T65 and T66 and to one end of a capacitor C12 whose other end is connected to terminal 10. The Emitters of transistors T50 and T51 are connected to terminal 3. The collector of transistor T52 is connected to terminal 10 and to the base of a transistor T54 whose emitter is connected to the collector of a transistor T55 and the base of a transistor T53. The emitter of transistor T53 is connected to the junction of a resistor R43, a resistor R47 and a resistor R50. The other end of resistor R43 is connected to the junction of resistor R44 and the collector and base of a transistor T40. The emitter of transistor T40 is connected to the collector and base of a transistor T41 whose emitter is in turn connected to the collector and base of a transistor T42. The emitter of transistor T42 is connected to one end of a resistor R45 the other end of which is connected to terminal 10, and to one end of a resistor R55 the other end of which is connected to the junction of the base of transistor T55, the base of a transistor T58, and the emitter of a transistor T57. The other end of resistor R47 is connected to the collector and base of a transistor T76, and to the base of a transistor T77. The other end of resistor R50 is connected to the junction of the base of transistor T46 and the base and collector of a transistor T47. The emitter of transistor T47 is connected to the base and collector of a transistor T48 whose emitter is in turn connected to the base and collector of a transistor T49. The emitter of transistor T49 is connected via a resistor R57 to terminal 10, and via a resistor R56 to the collector of a transistor T68, the emitters of two transistors T61 and T62, one end of a resistor R54, the junction of two diodes D10 and D11 connected in series between terminal 3 and terminal 10, and terminal 16. The collector of transistor T77 is connected to the emitters of transistors T44 and T45. The emitter of transistor T43 is connected to the base of transistor T44 and to a resistor R48 which is connected in series with a resistor R49 whose other end is connected to the junction of the base of transistor T45 and the emitter of transistor T46. The emitters of transistors T76 and T77 are connected to terminal 10. The collector of transistor T58 is connected to the base of a transistor T59 whose collector is connected to the emitter of transistor T58 and through a resistor R52 to terminal 3. The emitter of transistor T59 is connected to the junction of the collector of transistor T62, the collector of a transistor T63, the base of a transistor T64, and one end of a resistor R53 whose other end is connected to the junction of resistor R54 and the base of transistor T63. The emitter of transistor T63 is connected to the base of transistor T62. The emitters of transistors T64, T65 and T66 are commoned. The collector of transistor T66 is connected to the base of a transistor T67 and terminal 14. The collector of transistor T67 is connected to the collector of transistor T64 and to the base of transistor T56 while its emitter is connected to the base of transistor T68. The collectors of transistors T53, T54, T56, T57, T60 and T61 and the base of transistor T56 are all connected to terminal 3. The emitter of transistor T55 is connected via a resistor R51 to terminal 3. The emitter of transistor T60 is connected to the base of transistor T61. Terminal 13 is connected to the base of a transistor T70 and via a resistor R65 to terminal 3. The collector of transistor T70 is connected to the base of a transistor T71 whose emitter is connected to the base of a transistor T72 and to one end of a resistor R67 whose other end is connected to the junction of a diode D17 and the emitter of transistor T72. Terminal 12 is connected to the collector of a transistor T75, the base of a transistor T73 and via a resistor R66 to terminal 3. The series arrangement of two resistors R69 and R70 is connected between terminals 10 and 18, the junction of resistors R69 and R70 being connected to the base of a transistor T69. The collector of transistor T69 is connected to terminal 17 and via the series arrangement of a capacitor C14 and a resistor R71 to the other end of resistor R58. Terminal 19 is connected to the junction of diode D17, diode D19, the collectors of transistor T73 and a transistor T74 and terminals 18 and 21. The series arrangement of four diodes D13, D14, D15 and D16 and two resistors R72 and R73 is connected between terminals 10 and 18, the junction of resistors R72 and R73 being connected to the base of transistor T75. The collectors of transistors T71 and T72 and the emitter of transistor T70 are connected to terminal 3. The emitters of transistors T68, T69, T74 and T75 and the anode of diode D19 are all connected to terminal 10, A diode D18 is connected between terminals 3 and 19 while a capacitor C15 is connected between terminals 10 and 21. Terminal 16 is connected to one end of an inductor L2 the other end of which is connected to the junction of a capacitor C16 and one end of the parallel arrangement of a resistor R59 and a termistor R60. The other end of this parallel arrangement is connected to one end of a deflection coil L1. The other end of the deflection coil L1 is connected to a transductor 40 through which the waveform to correct for pin cushion distortion may be applied. Terminal 17 is connected via a resistor R68 to the transductor 40 and to the junction of a capacitor C13 and the slider of a potentiometer R63. The other end of capacitor C13 is connected to the junction of a resistor R64 and an inductor L3 the other end of which is connected to terminal 18. The other end of resistor R64 is connected to one end of potentiometer R63 whose other end is connected via resistor R62 and diode D12 to terminal 3. The other end of capacitor C16 is connected to terminal 10. A capacitor C12 is connected between terminals 10 and 20.

In operation the overshaped ramp voltage of terminal 11 is combined with the unshaped ramp voltage of terminal 4 in potentiometer R40. The proportion of each which is fed to the base of transistor T43 is dependent on the setting of potentiometer R40. The amplified ramp voltage is available at terminal 16 and is applied to the deflection coil L1. During the scan period there is no drive at terminal 13 and hence transistor T70 is switched OFF and therefore transistors T71 and T72 are also OFF. Hence there is no drive to transistor T75 and this is also OFF. Transistors T73 and T74 are ON and hence terminal 18 is held at approximately earth potential. Therefore current flows through the deflection coil L1 in the direction from terminal 16 to terminal 18.

During the flyback period a pre-day pulse is applied at terminal 14 for approximately the first 30% of the flyback period. This pulse is fed to the base of transistor T67 and hence transistors T67 and T68 are both turned OFF. Further, during the occurrence of the pre-delay pulse the signal applied to the base of transistor T43 is such that transistor T61 will be turned OFF and transistor T68 would be turned on in the absence of the pre-delay pulse.

A flyback pulse is applied via terminal 12 to the collector of transistor T75 and the base of transistor T73. This causes transistors T73 and T74 to switch OFF. Therefore, for the first 30% of the flyback period, there is no drive from either of terminals 16 or 18 to the deflection coil L1, the current being maintained by diodes D11 anad D18 and capacitors C15 and C16.

After the first 30% of the flyback peeriod the pre-delay pulse disappears allowing transistor T67 and T68 to switch ON thus holding terminal 16 at near earth potential. At the same time a delayed pulse is applied to the base of transistor T70 via terminal 13. This causes transistor T70 and hence transistors T71 and T72 to switch ON. Terminal 18 is now held at a potential near to that of the supply rail 5 and the deflection coil L1 is energised in the opposite direction from that during the scan period.

The field deflection output stage is protected from the effects of flashover in the tube in two ways. Firstly since the deflection coils are driven double-ended, i.e. the flyback and scan waveforms are applied separately, larger valued capacitors across the outputs of both the scan and flyback circuits than those possible with single ended drive circuits are acceptable. The capacitance of capacitors C15 and C16 may be, for example, as high as 220 nF instead of about 22 nF in the case of a single ended output stage. This means that a very low impedance is available to by-pass flashover effects, and the addition of inductors L2 and L3 gives extra protection to the output devices in the event of flashover in the tube.

Secondly a high voltage at terminal 18, and hence at the collector of transistor T74, causes diodes D13, D14, D15, and D16 to conduct and therefore transistor T75 switches ON. This lowers the potential at the base of the transistor T73 causing it and also transistor T74 to be switched OFF hence reducing the current through transistor T74 to its leakage current.

The use of delayed and pre-delay pulses, as described above, reduces the possibility of dangerous switching conditions, due to the presence of the capacitors, where high voltages and currents are present in the output devices at the same time.

What I claim is:

1. A field deflection circuit arrangement in which the flyback pulse produced across the deflection coil is clamped to a fixed potential, said deflection circuit comprising a sawtooth wave generator means adapted to be connected to a first source of direct voltage for producing a waveform having a scan period and a flyback period, said flyback period increasing as the amplitude of the sawtooth wave increases, said generator means having a control input means for varying said flyback period, an output stage adapted to be connected to a second source of direct voltage, and means for feeding said second source of direct voltage to said control input means of said sawtooth wave generator for causing the flyback period to decrease as the voltage of said second source of direct voltage increases.

2. A field deflection circuit arrangement as claimed in claim 1 in which said first source of direct voltage is derived from a line scan rectified supply.

3. A field deflection circuit arrangement as claimed in claim 1 in which said sawtooth wave generator comprises means for charging a capacitor to a potential which increases as the voltage of said first source of direct voltage increases and means for discharging said capacitor at a rate which is dependent on the voltage at the control input of said sawtooth wave generator.

4. A field deflection circuit arrangement as claimed in claim 3 in which said means for discharging said capacitor comprises the collector emitter path of a first transistor and said control input means of said sawtooth waveform generator is coupled to the base of said transistor.

5. A field deflection circuit arrangement as claimed in claim 4 further comprising a current mirror including said first transistor and a second transistor coupled to said first transistor.

6. A field deflection circuit arrangement as claimed in claim 1 in which said sawtooth wave generator includes means for generating a pulse during the flyback period.

7. A field deflection circuit arrangement as claimed in claim 6 including means for sub-dividing said pulse to produce further pulses each haaving a duration of less than said first mentioned pulse.

8. A field deflection circuit arrangement as claimed in claim 1 in which said output stage includes a first path means for applying a scan current to the deflection coil and a second path means for applying a flyback current to the deflection coil.

* * * * *